US007655280B2

United States Patent
Chang et al.

(10) Patent No.: US 7,655,280 B2
(45) Date of Patent: *Feb. 2, 2010

(54) EXTREME LOW RESISTIVITY LIGHT ATTENUATION ANTI-REFLECTION COATING STRUCTURE AND METHOD FOR MANUFACTURING THE SAME

(75) Inventors: Cheng-Chieh Chang, Hsinchu (TW); Shiu-Feng Liu, Hsinchu (TW); Pi-Jui Kuo, Hsinchu (TW)

(73) Assignee: Innovation & Infinity Global Corp., Hsinchu (TW)

( * ) Notice: Subject to any disclaimer, the term of this patent is extended or adjusted under 35 U.S.C. 154(b) by 168 days.

This patent is subject to a terminal disclaimer.

(21) Appl. No.: 11/905,886

(22) Filed: Oct. 5, 2007

(65) Prior Publication Data

US 2009/0092825 A1   Apr. 9, 2009

(51) Int. Cl.
*B05D 1/36* (2006.01)
*B05D 5/12* (2006.01)
*B32B 15/04* (2006.01)
*B32B 15/20* (2006.01)

(52) U.S. Cl. .............. 427/419.3; 427/125; 427/126.3; 427/162; 427/165; 427/404; 428/216; 428/336; 428/472; 428/432; 428/702; 428/622; 428/623; 428/632; 428/642; 428/650

(58) Field of Classification Search ............... None
See application file for complete search history.

(56) References Cited

U.S. PATENT DOCUMENTS

2002/0086164 A1* 7/2002 Anzaki et al. ............... 428/432

* cited by examiner

*Primary Examiner*—Ling Xu
(74) *Attorney, Agent, or Firm*—Rosenberg, Klein & Lee

(57) ABSTRACT

A extreme low resistivity light attenuation anti-reflection coating structure includes a substrate, a coating module, and a composed protection coating layer. The coating module is formed on a front surface of the substrate. The coating module is composed of a plurality of Ti-based oxide coating layers and a plurality of metal coating layers that are alternately stacked with each other. The composed protection coating layer is formed on the coating module.

9 Claims, 2 Drawing Sheets

EXTREME LOW RESISTIVITY LIGHT ATTENUATION ANTI-REFLECTION COATING STRUCTURE AND METHOD FOR MANUFACTURING THE SAME

BACKGROUND OF THE INVENTION

1. Field of the Invention

The present invention relates to a coating structure and a method for manufacturing the same, and particularly relates to an extreme low resistivity light attenuation anti-reflection coating structure with a transparent surface conductive layer and a method for manufacturing the same.

2. Description of the Related Art

It is well known that the conventional layer structure for an anti-reflection optical coating has a general principle. This general principle is that the surface layer of the optical coating should be a material that scores low on the refractive index such as $SiO_2$, scoring 1.46 on the refractive index, or $MgF_2$, scoring 1.38 on the refractive index. However, when we apply the metal base anti-reflection coating on a display screen to create a high EMI shielding effect for a computer monitor, or low reflection glass for an LCD or a PDP, there are some bottlenecks in the process for high volume mass production. The basic reason for this is that the protective layer for example $SiO_2$ or $MgF_2$ of the optical layer structure is nature porous in microstructure and allow the $H_2O$ vapor diffuse into the inside low resistivity metal thin layer to change the electric and optical characteristic of the layer system.

On the other hand, in the general design rule for an anti-reflection coating, the first layer deposited on the substrate surface is a material with a high score on the refractive index (hereafter referred to as H), which is then followed by a second layer that is a material with a low score on the refractive index (hereafter referred to as L). The basic design rule for the conventional anti-reflection coating is that there is a layer structure such as HLHL or HLHLHL. In a simple case, if the materials of H are ITO and the materials of L are $SiO_2$, the 4-layered structure is glass/ITO/$SiO_2$/ITO/$SiO_2$. Because ITO is a transparent conductive material, the multi-layer coating of this layer structure has electrical conductivity of less than 100Ω/square, and can be used as an EMI shielding and/or electric static discharge when the conductive coating layer is bonded to the ground. However, when the electronic circuit move to more fast speed and more powerful function. A significant request for extreme low resistivity, namely $\leq 0.6$Ω/square, were ask for provide better function in EMI (Electronic magnetic Interference) shielding. Conventional multi-layer ITO coating have good performance in resistivity range of several Ω/square. However, below 1.0Ω/square will largely increase the difficulty of mass production and result in a very high cost in final application.

On the other hand, although thin metal layer has good conductivity in electrical characteristic, but the metal also has much limitation in the application to form a multi optical layer system.

A well know phenomenon of thin film metal layer is the durability of thin metal layer. Once water vapor diffuse into the surface and contact with the thin metal layer, a oxidation process will occur spontaneously and finally change the chemical property of thin metal layer and significantly change the electrical and optical characteristic of the optical layer system. A design of special compound layer was used as a surface protect layer for this invention. This surface protective layer were compose of Titanium oxide, Silicon dioxide and Aluminum oxide. The protective layer is a effective diffusion barrier to prevent the water vapor diffuse from the surface into inner metal layer.

SUMMARY OF THE INVENTION

One particular aspect of the present invention is to provide an extreme low resistivity light attenuation anti-reflection coating structure with a surface protective layer. The process of manufacturing the extreme low resistivity light attenuation anti-reflection coating structure in high volume production is highly reliable and has been routinely used in industries such as semiconductor manufacturing, disc head manufacturing, LCD manufacturing, CRT manufacturing, architecture glass manufacturing, touch sensor display manufacturing, screen filter manufacturing and plastic web coating for more than twenty years.

The material of the surface layer of the extreme low resistivity light attenuation anti-reflection coating is a high refractive index protective layer. The reflectivity of the extreme low resistivity light attenuation anti-reflection coating is below 0.5%. The resistivity of the anti-reflection coating is as low as 0.5Ω/square to 0.7Ω/square, and its transparency is between 40% and 65%.

The layer system of the present invention is also highly conductive for EMI (Electromagnetic Interference) shielding, has low reflectivity for optical viewing, is highly scratch resistance for surface hardness, and has moderate light attenuation effects for manufacturing PDP displays. For instance, the layer system has a resistance of between 0.5Ω/square and 0.7Ω/square and is hard enough to pass the scratch test of military standard MIL-C-48497.

After a coating module is formed on a substrate, a shutter is arranged on a top surface of the coating module. The shutter has a size smaller than that of the coating module in order to expose a surrounding area of the top surface of the coating module. Afterward a conductive layer is coated on the surrounding area of the top surface of the coating module in order to connect to the ground and achieve good electrical contact. Finally, the shutter is removed. In addition, the conductive layer can be a silver paste.

In order to achieve the above-mentioned aspects, the present invention provides an extreme low resistivity light attenuation anti-reflection coating structure. The coating structure comprises a substrate, a coating module, and a composed protection coating layer. The coating module is formed on a front surface of the substrate and is composed of a plurality of Ti-based oxide coating layers and a plurality of metal coating layers that are alternately stacked with each other. The composed protection coating layer is formed on the coating module In order to achieve the above-mentioned aspects, the present invention provides a method for manufacturing an extreme low resistivity light attenuation anti-reflection coating structure. The method comprises providing a substrate, forming a coating module on a front surface of the substrate, and forming a compound protection coating layer on the coating module. The coating module is composed of a plurality of Ti-based oxide coating layers and a plurality of metal coating layers that are alternately stacked with each other.

In one embodiment of the present invention of the anti-reflection coating structure has 9 layers and includes a first coating layer, a second coating layer, a third coating layer, a fourth coating layer, a fifth coating layer, a sixth coating layer, a seventh coating layer, an eighth coating layer and a compound protection coating layer formed on a substrate in sequence. Each layer is described in terms of physical or optical thickness. The optical thickness is a mathematical product of a layer's thickness and its score on the refractive index. It is described as a fraction of a designed wavelength. In the present invention the designed wavelength is about 520 nm.

The first coating layer or the surface layer is a transparent Ti-based oxide coating layer. The Ti-based oxide coating layer is preferably $TiO_2$ for slightly absorbing visible light, which scores 2.4 on the refractive index at a wavelength of about 520 nm and has a physical thickness of 30 nm at the designed wavelength.

The second coating layer is a metal coating layer. The metal coating layer is preferably Ag (silver), is slightly absorbent of visible light, scores between 0.1 and 0.5 on the refractive index, at a wavelength of about 520 nm, and has a physical thickness of 14 nm at the designed wavelength.

The third coating layer is a transparent Ti-based oxide coating layer. The Ti-based oxide coating layer is preferably $TiO_2$ for slightly absorbing visible light, which scores 2.4 on the refractive index at a wavelength of about 520 nm and has a physical thickness of 66 nm at the designed wavelength.

The fourth coating layer is a metal coating layer. The metal coating layer is preferably Ag (silver), is slightly absorbent of visible light, scores between 0.1 and 0.5 on the refractive index, at a wavelength of about 520 nm, and has a physical thickness of 14 nm at the designed wavelength.

The fifth coating layer is a transparent Ti-based oxide coating layer. The Ti-based oxide coating layer is preferably $TiO_2$ for slightly absorbing visible light, which scores 2.4 on the refractive index at a wavelength of about 520 nm and has a physical thickness of 60 nm at the designed wavelength.

The sixth coating layer is a metal coating layer. The metal coating layer is preferably Ag (silver), is slightly absorbent of visible light, scores between 0.1 and 0.5 on the refractive index, at a wavelength of about 520 nm, and has a physical thickness of 14 nm at the designed wavelength.

The seventh coating layer is a transparent Ti-based oxide coating layer. The Ti-based oxide coating layer is preferably $TiO_2$ for slightly absorbing visible light, which scores 2.4 on the refractive index at a wavelength of about 520 nm and has a physical thickness of 70 nm at the designed wavelength.

The eighth coating layer is a metal coating layer. The metal coating layer is preferably Ag (silver), is slightly absorbent of visible light, scores between 0.1 and 0.5 on the refractive index, at a wavelength of about 520 nm, and has a physical thickness of 14 nm at the designed wavelength.

The compound protection coating layer is a surface protective layer. The compound protection coating layer composes of Titanium oxide, Silicon dioxide and Aluminum oxide, which scores 2.2 on the refractive index at a wavelength of about 520 nm and has a physical thickness of 40 nm at the designed wavelength.

Because the surface layer has good protective properties, the surface layer act as a diffusion barrier totally prevent the water vapor diffuse into the inner metal layer and keep high reliability in environmental of the whole application. The present invention provides an extreme low resistivity shielding of an anti-reflection coating that can be applied to the LCD and PDP display industries for glass and plastic film substrates.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which.

DETAILED DESCRIPTION OF THE PREFERRED EMBODIMENTS

Figure 1:
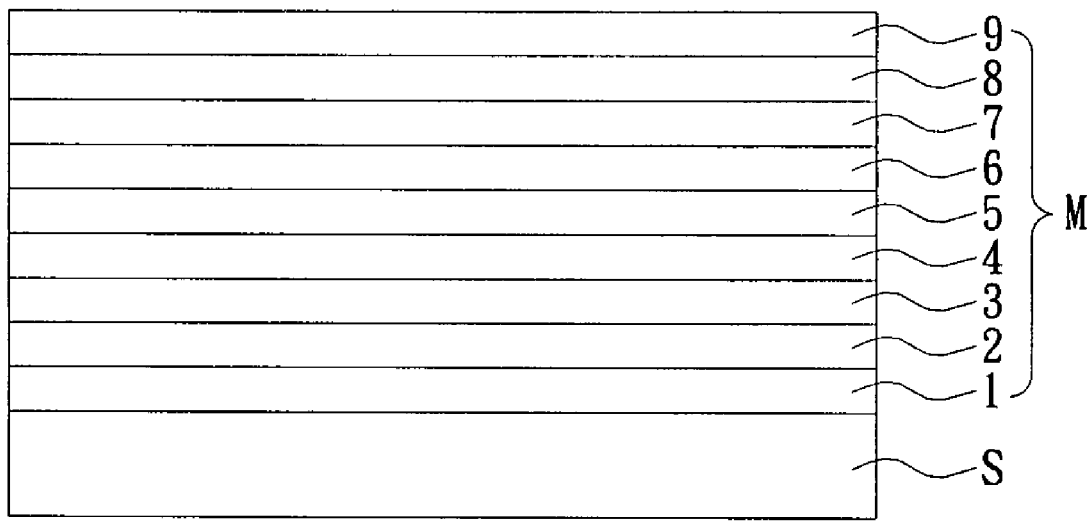
FIG. 1 is a front, schematic view of an extreme low resistivity light attenuation anti-reflection coating structure according to the present invention.

Referring to FIG. 1, the present invention provides an extreme low resistivity light attenuation anti-reflection coating structure. The coating structure includes a substrate S and a coating module M.

The substrate S can be a plastic film or a glass. The coating module M can be a basic coating for a plasma display or a liquid crystal display.

Moreover, the coating module M includes a first coating layer 1 formed on a front surface of the substrate S, a second coating layer 2 formed on the first coating layer 1, a third coating layer 3 formed on the second coating layer 2, a fourth coating layer 4 formed on the third coating layer 3, a fifth coating layer 5 formed on the fourth coating layer 4, a sixth coating layer 6 formed on the fifth coating layer 5, a seventh coating layer 7 formed on the sixth coating layer 6, an eighth coating layer 8 formed on the seventh coating layer 7, and a compound protection coating layer 9 formed on the eighth coating layer 8.

Furthermore the first coating layer 1, the third coating layer 3, the fifth coating layer 5, and the seventh coating layer 7 are Ti-based oxide coating layers. The second coating layer 2, the fourth coating layer 4, the sixth coating layer 6, and the eighth coating layer 8 are metal coating layers. The compound protection coating layer 9 is composed of $TiO_2$, $SiO_2$, and $Al_2O_3$. In addition, each Ti-based oxide coating layer is TiO2, and each metal coating layer is Ag (silver). Each Ti-based oxide coating layer has a refractive index larger than that of each metal coating layer.

Therefore, the coating module M is formed on the front surface of the substrate S and is composed of a plurality of Ti-based oxide coating layers and a plurality of metal coating layers that are alternately stacked with each other.

Moreover, the refractive indexes of the first coating layer 1, the third coating layer 3, the fifth coating layer 5, and the seventh coating layer 7 are 2.4, and the refractive indexes of the second coating layer 2, the fourth coating layer 4, the sixth coating layer 6, and the eighth coating layer 8 are between 0.1~0.5. The refractive index of the compound protection coating layer is 2.2. Furthermore, the thickness of the first coating layer 1 is 30 nm, the thickness of the second coating layer 2 is 14 nm, the thickness of the third coating layer 3 is 66 nm, the thickness of the fourth coating layer 4 is 14 nm, the thickness of the fifth coating layer 5 is 60 nm, the thickness of the sixth coating layer 6 is 14 nm, the thickness of the seventh coating layer 7 is 70 nm, the thickness of the eighth coating layer 8 is 14 nm, and the thickness of the compound protection coating layer 9 is 40 nm.

In addition, the first coating layer 1, the third coating layer 3, the fifth coating layer 5, the seventh coating layer 7 (the Ti-based oxide coating layers), and the compound protection coating layer 9 are formed by a DC or AC magnetron sputtering method. The second coating layer 2, the fourth coating layer 4, the sixth coating layer 6, and the eighth coating layer 8 (the metal coating layers) are formed by a DC or AC magnetron sputtering method. Moreover, all of the coating layers (from the first coating layer 1 to the compound protection coating layer 9) are formed by an in-line or roll-to-roll vacuum sputtering method.

Figure 2:
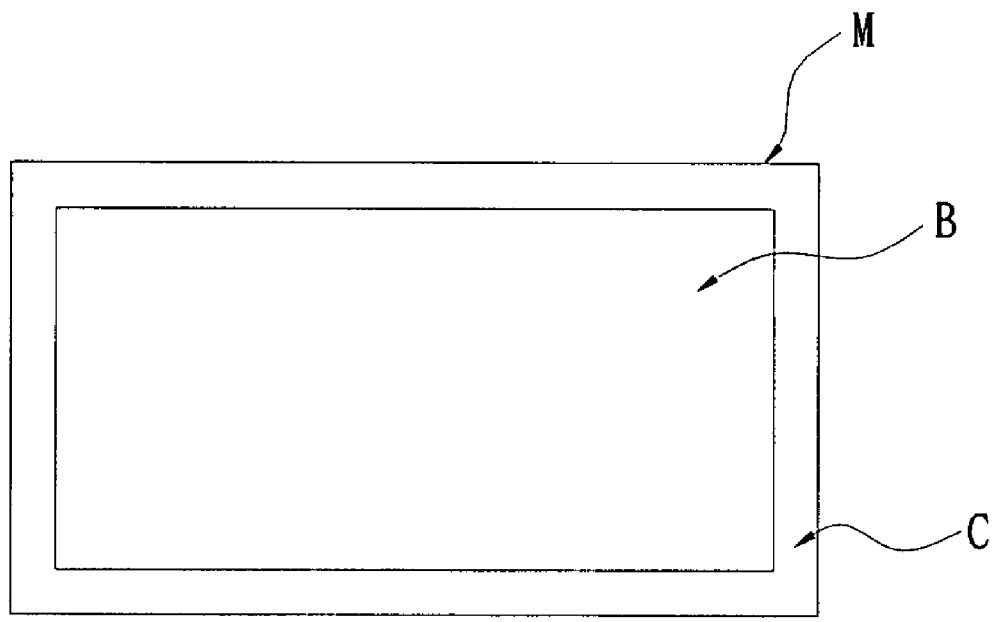
FIG. 2 is a top, schematic view of an extreme low resistivity light attenuation anti-reflection coating structure according to the present invention.

Referring to FIG. 2, the extreme low resistivity light attenuation anti-reflection coating structure of the present invention further includes a conductive layer C formed on a surrounding area of a top surface of the coating module M for connecting to a ground. Therefore, the conductive layer C is formed on a surrounding area of a top surface of the compound protection coating layer 9 of the coating module M for connecting to the ground. In other words, after the coating module M is formed on the substrate S, a shutter B is arranged on the top surface of the coating module M. The shutter B has a size smaller than that of the coating module M in order to expose a surrounding area of the top surface of the coating module M. Afterward a conductive layer C is coated on the surrounding area of the top surface of the coating module M in order to connect to the ground and achieve good electrical contact. Finally, the shutter B is removed. In addition, the conductive layer C can be a silver paste.

Figure 3:
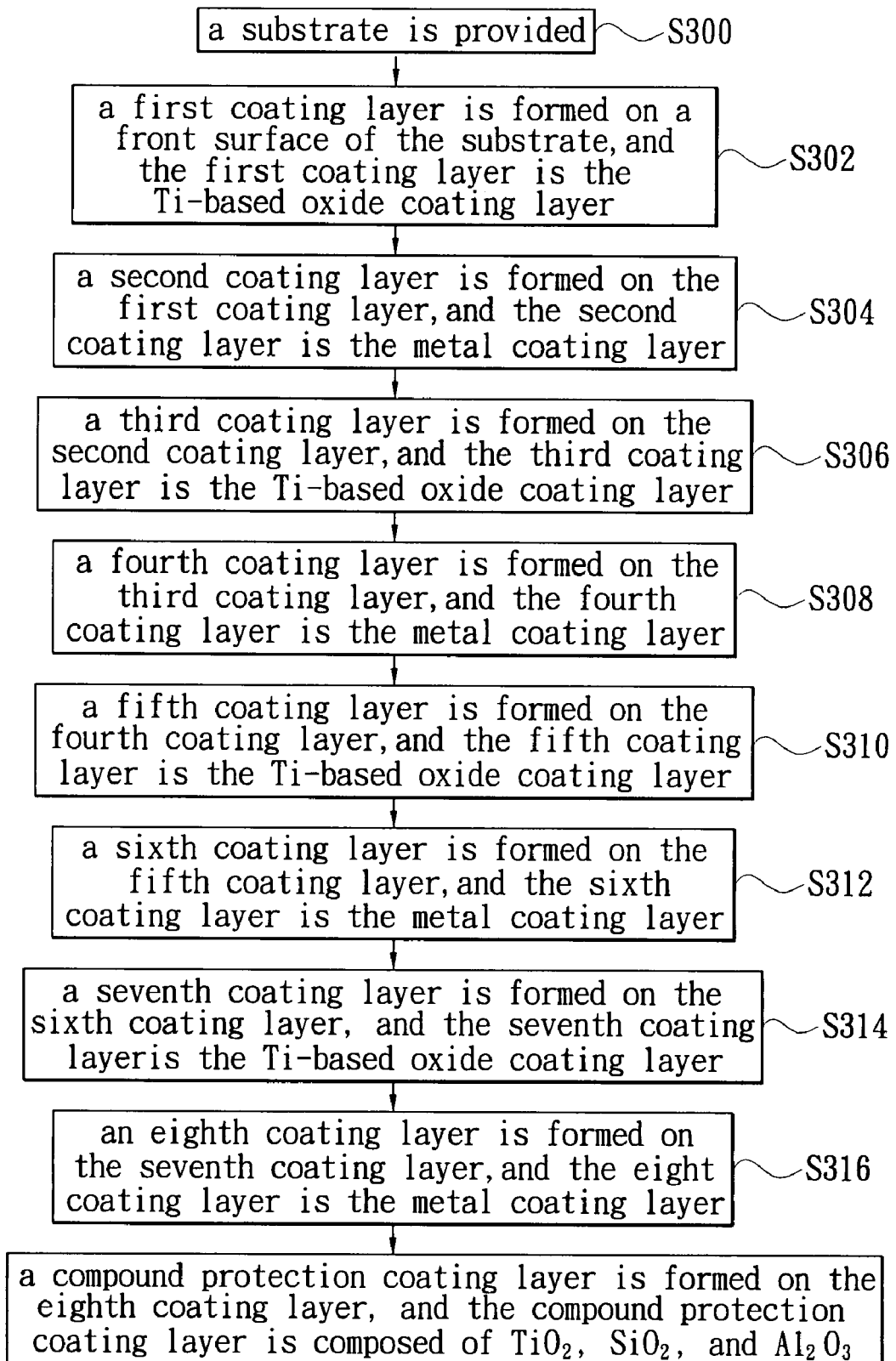
FIG. 3 is a flow chart of a method for manufacturing an extreme low resistivity light attenuation anti-reflection coating structure according to the present invention.

Referring to FIG. 3, the present invention provides a method for manufacturing an extreme low resistivity light attenuation anti-reflection coating structure. The method includes:

S300: a substrate S is provided;

S302: a first coating layer 1 is formed on a front surface of the substrate S, and the first coating layer 1 is the Ti-based oxide coating layer;

S304: a second coating layer 2 is formed on the first coating layer 1, and the second coating layer 2 is the metal coating layer;

S306: a third coating layer 3 is formed on the second coating layer 2, and the third coating layer 3 is the Ti-based oxide coating layer;

S308: a fourth coating layer 4 is formed on the third coating layer 3, and the fourth coating layer 4 is the metal coating layer;

S310: a fifth coating layer 5 is formed on the fourth coating layer 4, and the fifth coating layer 5 is the Ti-based oxide coating layer;

S312: a sixth coating layer 6 is formed on the fifth coating layer 5, and the sixth coating layer 6 is the metal coating layer;

S314: a seventh coating layer 7 is formed on the sixth coating layer 6, and the seventh coating layer 7 is the Ti-based oxide coating layer;

S316: an eighth coating layer 8 is formed on the seventh coating layer 7, and the eight coating layer 8 is the metal coating layer; and S318: a compound protection coating layer 9 is formed on the eighth coating layer 8, and the compound protection coating layer 9 is composed of $TiO_2$, $SiO_2$, and $Al_2O_3$.

In conclusion, the process of manufacturing the extreme low resistivity light attenuation anti-reflection coating structure in high volume production is highly reliable and has been routinely used in industries such as semiconductor manufacturing, disc head manufacturing, LCD manufacturing, CRT manufacturing, architecture glass manufacturing, touch sensor display manufacturing, screen filter manufacturing and plastic web coating for more than twenty years.

Moreover, the material of the surface layer of the extreme low resistivity light attenuation anti-reflection coating is composed of $TiO_2$, $SiO_2$, and $Al_2O_3$. The reflectivity of the extreme low resistivity light attenuation anti-reflection coating structure is below 0.5%. The resistivity of the anti-reflection coating is as low as $0.5\Omega$/square to $0.7\Omega$/square, and its transparency is between 40% and 65%.

Furthermore, the layer system of the present invention is also highly conductive for EMI (Electromagnetic Interference) shielding, has low reflectivity for optical viewing, is highly scratch resistance for surface hardness, and has moderate light attenuation effects for manufacturing PDP displays. For instance, the layer system has a surface resistance of between $0.5\Omega$/square and $0.7\Omega$/square and is hard enough to pass the scratch test of military standard MIL-C-48497.

Because of the design of shutter and mask the surrounding area of the surface layer has good electrical conductive properties, the surface contact area layer reduces much of the work in the grounding process and also increases the total yield and reliability in high volume production. The present invention provides a surface contact conductive area structure with an anti-reflection coating that can be applied to the LCD and PDP display industries for glass and plastic film substrates.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for manufacturing a light attenuation anti-reflection coating structure with a resistivity less than $1\Omega$/square, comprising:

providing a substrate;

forming a coating module on a front surface of the substrate, wherein the coating module is composed of a plurality of Ti-based oxide coating layers and a plurality of metal coating layers that are alternately stacked with each other;

forming a compound protection coating layer on the coating module;

arranging a shutter on a top surface of the coating module, wherein the shutter has a size smaller than that of the coating module for exposing a surrounding area of the top surface of the coating module; and coating a conductive layer on the surrounding area of the top surface of the coating module for connecting to a ground.

2. The method as claimed in claim 1, wherein the substrate is a plastic film.

3. The method as claimed in claim 1, wherein the substrate is a glass.

4. The method as claimed in claim 1, wherein the coating module is a basic coating for a plasma display or a liquid crystal display.

5. The method as claimed in claim 1, wherein each Ti-based oxide coating layer is TiO2, each metal coating layer is Ag (silver), and the compound protection coating layer is composed of TiO2, SiO2, and Al2O3.

6. The method as claimed in claim 1, wherein the step of forming a coating module includes the steps of:

forming a first coating layer on the front surface of the substrate, wherein the first coating layer is the Ti-based oxide coating layer;

forming a second coating layer on the first coating layer, wherein the second coating layer is the metal coating layer;

forming a third coating layer on the second coating layer, wherein the third coating layer is the Ti-based oxide coating layer;

forming a fourth coating layer on the third coating layer, wherein the fourth coating layer is the metal coating layer;

forming a fifth coating layer on the fourth coating layer, wherein the fifth coating layer is the Ti-based oxide coating layer;

forming a sixth coating layer on the fifth coating layer, wherein the sixth coating layer is the metal coating layer;

forming a seventh coating layer on the sixth coating layer, wherein the seventh coating layer is the Ti-based oxide coating layer;

forming an eighth coating layer on the seventh coating layer, wherein the eight coating layer is the metal coating layer.

7. The method as claimed in claim 6, wherein each Ti-based oxide coating layer has a refractive index larger than that of each metal coating layer.

8. The method as claimed in claim 6, wherein the refractive indexes of the first coating layer, the third coating layer, the fifth coating layer, and the seventh coating layer are 2.4; wherein the refractive indexes of the second coating layer, the fourth coating layer, the sixth coating layer, and the eighth coating layer are between 0.1~0.5; wherein the refractive index of the compound protection coating layer is 2.2.

9. The method as claimed in claim 6, wherein the first coating layer having a thickness is 30 nm; the second coating layer having a thickness is 14 nm; the third coating layer having a thickness is 66 nm; the fourth coating layer having a thickness is 14 nm; the fifth coating layer having a thickness is 60 nm; the sixth coating layer having a thickness is 14 nm; the seventh coating layer having a thickness is 70 nm; the eighth coating layer having a thickness is 14 nm; and the compound protection coating layer having a thickness is 40 nm.

* * * * *